(12) United States Patent
Den Boef et al.

(10) Patent No.: US 8,508,736 B2
(45) Date of Patent: Aug. 13, 2013

(54) TUNABLE WAVELENGTH ILLUMINATION SYSTEM

(75) Inventors: Arie Jeffrey Den Boef, Waalre (NL); Harry Sewell, Ridgefield, CT (US); Keith William Andresen, Wilton, CT (US); Earl William Ebert, Jr., Oxford, CT (US); Sanjeev Kumar Singh, Danbury, CT (US)

(73) Assignees: ASML Holding N.V., Veldhoven (NL); ASML Netherlands B.V., Veldhoven (NL)

( * ) Notice: Subject to any disclaimer, the term of this patent is extended or adjusted under 35 U.S.C. 154(b) by 425 days.

(21) Appl. No.: 12/751,479

(22) Filed: Mar. 31, 2010

(65) Prior Publication Data

US 2011/0085726 A1    Apr. 14, 2011

Related U.S. Application Data

(60) Provisional application No. 61/168,095, filed on Apr. 9, 2009.

(51) Int. Cl.
*G01B 11/00* (2006.01)

(52) U.S. Cl.
USPC ................................................ 356/401

(58) Field of Classification Search
USPC ................................................ 356/401
See application file for complete search history.

(56) References Cited

U.S. PATENT DOCUMENTS

| | | | | |
|---|---|---|---|---|
| 4,362,809 A | * | 12/1982 | Chen et al. | 430/312 |
| 4,862,008 A | * | 8/1989 | Oshida et al. | 250/548 |
| 5,477,321 A | | 12/1995 | Johnson | |
| 6,768,750 B2 | * | 7/2004 | Kuksenkov | 372/20 |
| 6,819,478 B1 | * | 11/2004 | Islam | 359/334 |
| 6,921,916 B2 | | 7/2005 | Adel et al. | |
| 6,965,431 B2 | * | 11/2005 | Vo-Dinh et al. | 356/301 |
| 7,653,109 B2 | * | 1/2010 | Bischel et al. | 372/50.12 |
| 2002/0102812 A1 | * | 8/2002 | Yeh et al. | 438/401 |

(Continued)

FOREIGN PATENT DOCUMENTS

| EP | 1 596 252 A1 | 11/2005 |
|---|---|---|
| EP | 2009/030004 | * 3/2009 |

(Continued)

OTHER PUBLICATIONS

J.Chen, High Repetition Rate, Low Jitter, Fundamentally Mode-locked Soliton Er-fiber Laser,2006, http://ultralaser.iphy.ac.cn/cleo/data/papers/CThHH3.pdf.*

(Continued)

*Primary Examiner* — Tarifur Chowdhury
*Assistant Examiner* — Sunghee Y Gray
(74) *Attorney, Agent, or Firm* — Sterne, Kessler, Goldstein & Fox P.L.L.C.

(57) ABSTRACT

A lithographic apparatus has an alignment system including a radiation source configured to convert narrow-band radiation into continuous, flat and broad-band radiation. An acoustically tunable narrow pass-band filter filters the broad-band radiation into narrow-band linearly polarized radiation. The narrow-band radiation may be focused on alignment targets of a wafer so as to enable alignment of the wafer. In an embodiment, the filter is configured to modulate an intensity and wavelength of radiation produced by the radiation source and to have multiple simultaneous pass-bands. The radiation source generates radiation that has high spatial coherence and low temporal coherence.

21 Claims, 7 Drawing Sheets

(56) References Cited

U.S. PATENT DOCUMENTS

2006/0268393 A1* 11/2006 Islam .................... 359/337.5
2008/0239265 A1* 10/2008 Den Boef ................. 355/53
2010/0198397 A1    8/2010 Berghmans

FOREIGN PATENT DOCUMENTS

| JP | 07-045894 A | 2/1995 |
|---|---|---|
| JP | 07-183203 A | 7/1995 |
| JP | 08-075640 A | 3/1996 |
| JP | 2001-358068 A | 12/2001 |
| JP | 2003-065955 | 3/2003 |
| JP | 2003-065955 A | 3/2003 |
| JP | 2006-518942 A | 8/2006 |
| JP | 2007-010666 A | 1/2007 |
| JP | 2005-0263187 A | 10/2008 |
| JP | 2008-263187 A | 10/2008 |
| JP | 2009-038339 A | 10/2008 |
| JP | 2009-038339 A | 2/2009 |
| JP | 2010-537278 A | 12/2010 |

OTHER PUBLICATIONS

De Bruijn, R., et al., "Absorption of EUV in laser plasmas generated on xenon gas jets," Journal of Quantitative Spectroscopy & Radiative Transfer, vol. 81, 2003; pp. 97-105.

English translation of Japanese Notice of Reasons for Rejection directed to related Japanese Application No. 2010-085601, form the Japanese Patent Office, mailed Jan. 5, 2012; 4 pages.

* cited by examiner

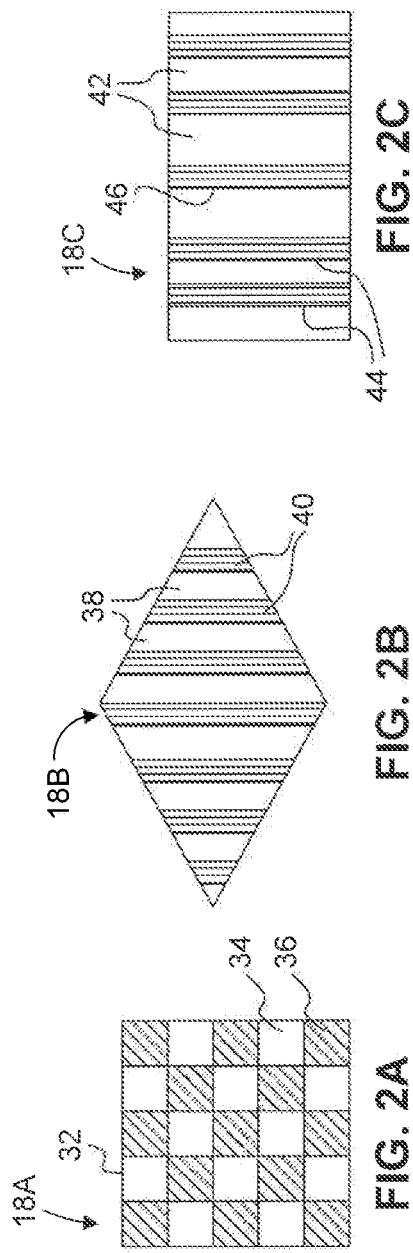
FIGS. 2A-E

TUNABLE WAVELENGTH ILLUMINATION SYSTEM

CROSS REFERENCE TO RELATED APPLICATIONS

This patent application claims the benefit of U.S. Provisional Patent Application No. 61/168,095 filed on Apr. 9, 2009, entitled "Tunable Wavelength Illumination System", which is incorporated by reference herein in its entirety.

BACKGROUND

1. Field of Invention

The present invention generally relates generally to an illumination system of the type used in lithographic apparatus for semiconductor wafer manufacture.

2. Related Art

A lithographic apparatus applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically carried out by imaging the pattern using a UV radiation beam onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate. Another lithographic system is an interferometric lithographic system where there is no patterning device, but rather a light beam is split into two beams, and the two beams are caused to interfere at a target portion of substrate through the use of a reflection system. The interference causes lines to be formed on at the target portion of the substrate.

Lithography apparatus may use an alignment system for detecting the position of alignment marks on a wafer and align the wafer using the alignment marks to ensure accurate exposure from a mask. Alignment systems typically have their own illumination source. The signal detected from the illuminated alignment marks can be affected by how well the illumination wavelengths are matched to the physical or optical characteristics of the alignment marks, or physical or optical characteristics of materials in contact with or adjacent to the alignment marks. The aforementioned characteristics can vary depending on the processing steps used. Phase-grating alignment systems commonly offer a set of discrete, relatively narrow band illumination wavelengths in order to maximize the quality and intensity of alignment mark signals detected by the alignment system. The specific discrete wavelengths are often limited to the types of sources commercially available.

While a selection of discrete wavelengths allows flexibility to choose a wavelength that improves the alignment signal for a given set of alignment mark and other local characteristics as described earlier, certain lithographic processes and/or alignment marks may require an illumination wavelength that falls outside the discrete wavelengths that are generated by conventional alignment systems. If the optimal narrow band of radiation required for a particular alignment mark or lithographic process falls in between, or outside of, a set of discrete set point options, the alignment performance will be adversely affected, perhaps to the level that alignment is not possible. This limitation reduces the flexibility to modify lithographic processes and/or alignment marks. Methods and systems are needed to overcome the above mentioned deficiencies.

BRIEF SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

It is desirable to provide a lithographic apparatus which reduces the aforementioned problems.

Consistent with the principles of the present invention as embodied and broadly described herein, the present invention is described in part by various embodiments. According to one embodiment of the present invention, there is provided an alignment system for a lithographic apparatus. The alignment system includes a radiation source configured to convert narrow-band radiation into continuous, flat and broad-band radiation. An acoustically tunable narrow pass-band filter is coupled to the radiation source and is configured to filter the broad-band radiation into narrow-band linearly polarized radiation. The narrow-band radiation may be focused on alignment targets of a wafer so as to enable alignment of the wafer. In one embodiment, the target is a grating. In another embodiment, the target may be one that is used in a pattern recognition system. The filter is configured to modulate an intensity and wavelength of radiation produced by the radiation source and to have multiple simultaneous pass-bands. The radiation source may comprise a fiber amplifier configured to generate high intensity short pulse radiation with a high repetition rate. The radiation source may also comprise photonic crystal fibers coupled to the fiber amplifier and configured to generate the continuous, flat and broad spectrum of radiation from the high intensity short pulse radiation. The radiation source has high spatial coherence and low temporal coherence.

Another embodiment of the present invention provides a method for aligning a wafer. A first high intensity short-pulse radiation is generated and propagated through a non-linear device to generate a second continuous, broad and flat spectrum radiation. The second radiation is acoustically filtered to generate narrow-band linearly polarized radiation. The method may also comprise illuminating an alignment target with the narrow-band radiation to enable alignment of a wafer. The filtering may further comprise modulating an intensity and wavelength of the second radiation and generating multiple simultaneous pass-band filters. In an embodiment, the first radiation is high intensity short pulse radiation with a high repetition rate and the second radiation has high spatial coherence and low temporal coherence.

A further embodiment of the invention provides an alignment system that includes an illumination source that is tunable to desired narrow-band wavelengths over a continuous broad spectral range. The illumination source includes a tunable filter that selects only a desired wavelength set point up to a few or several nanometers wide within an available spectral tuning range by blocking out-of-band wavelengths to a level that does not adversely effect alignment for detecting a position of alignment mark on a wafer to align the wafer using the alignment mark. The illumination source further includes an optics system configured to cover the continuous broad spectral range of the illumination source, wherein the alignment mark having a relatively narrow spectral band over which an alignment mark signal is above a predetermined acceptable threshold and the desired wavelength set point substantially matches the relatively narrow spectral band.

Further features and advantages of the invention, as well as the structure and operation of various embodiments of the present invention, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

The accompanying drawings, which are incorporated herein and form a part of the specification, illustrate one or more embodiments of the present invention and, together with the description, further serve to explain the principles of the invention and to enable a person skilled in the pertinent art to make and use the invention.

FIGS. 2A-E illustrate example alignment marks.

Figure 1A:
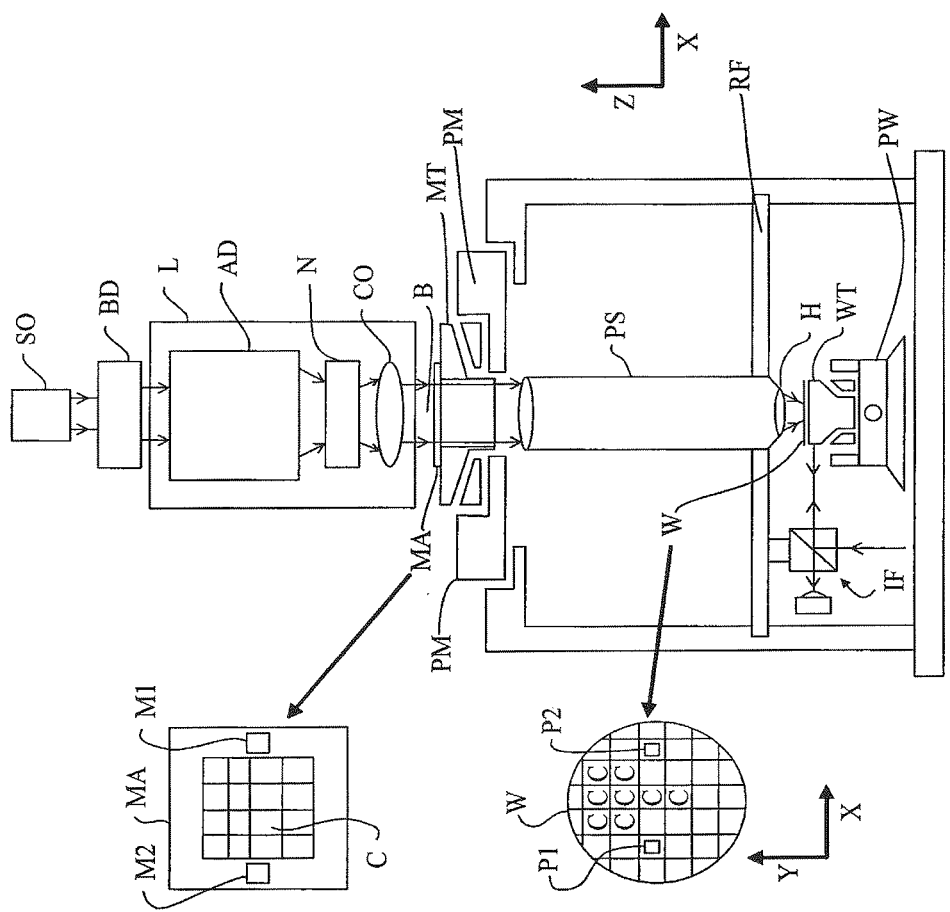
FIG. 1A is a schematic representation of an example lithographic apparatus.

One or more embodiments of the present invention will now be described with reference to the accompanying drawings. In the drawings, like reference numbers can indicate identical or functionally similar elements. Additionally, the left-most digit(s) of a reference number can identify the drawing in which the reference number first appears.

DETAILED DESCRIPTION OF THE INVENTION

The invention will be better understood from the following descriptions of various "embodiments" of the invention. Thus, specific "embodiments" are views of the invention, but each does not itself represent the whole invention. In many cases individual elements from one particular embodiment may be substituted for different elements in another embodiment carrying out a similar or corresponding function. The scope of the invention is not limited to the disclosed embodiment(s). The invention is defined by the claims appended hereto.

The embodiment(s) described, and references in the specification to "one embodiment", "an embodiment", "an example embodiment", etc., indicate that the embodiment(s) described can include a particular feature, structure, or characteristic, but every embodiment cannot necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Embodiments of the invention can be implemented in hardware, firmware, software, or any combination thereof. Embodiments of the invention can also be implemented as instructions stored on a machine-readable medium, which can be read and executed by one or more processors. A machine-readable medium can include any mechanism for storing or transmitting information in a form readable by a machine (e.g., a computing device). For example, a machine-readable medium can include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions can be described herein as performing certain actions. However, it should be appreciated that such descriptions are merely for convenience and that such actions in fact result from computing devices, processors, controllers, or other devices executing the firmware, software, routines, instructions, etc.

FIG. 1A schematically depicts an embodiment of lithographic apparatus suitable for use with the invention. Other arrangements of lithographic apparatus are also suitable for use with the invention. This exemplary lithographic apparatus includes: an illumination system (illuminator) L configured to condition a radiation beam B (e.g., UV radiation, DUV radiation, etc.), a support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist-coated wafer) Wand connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e., bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may include a frame RF or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is-reflected by the mirror matrix.

Further, in an interferometric lithographic system there is no patterning device, but rather a light beam is split into two beams, and the two beams are caused to interfere at a target portion of substrate through the use of a reflection system. The interference causes lines to be formed on at the target portion of the substrate.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system."

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1A, the illuminator L receives a radiation beam from a radiation source SO. The source and the lithographic apparatus may be separate elements, for example when the source is an excimer laser. In such cases, the source is not considered to form part of the lithographic apparatus and the radiation beam is passed from the source SO to the illuminator L with the aid of a beam delivery system BD comprising, for example, suitable directing mirrors and/or a beam expander. In other cases the source may be an integral part of the lithographic apparatus, for example when the source is a mercury lamp. The source SO and the illuminator L, together with the beam delivery system BD if required, may be referred to as a radiation system.

The illuminator L may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator L may comprise various other components, such as an integrator N and a condenser CO. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF (e.g., an interferometric device, linear encoder or capacitive sensor), the substrate table WT can be moved accurately, e.g., so as to position different target portions C in the path of the radiation beam B. Similarly, the first positioner PM and another position sensor (which is not explicitly depicted in FIG. 1) can be used to accurately position the mask MA with respect to the path of the radiation beam B, e.g., after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 1B:
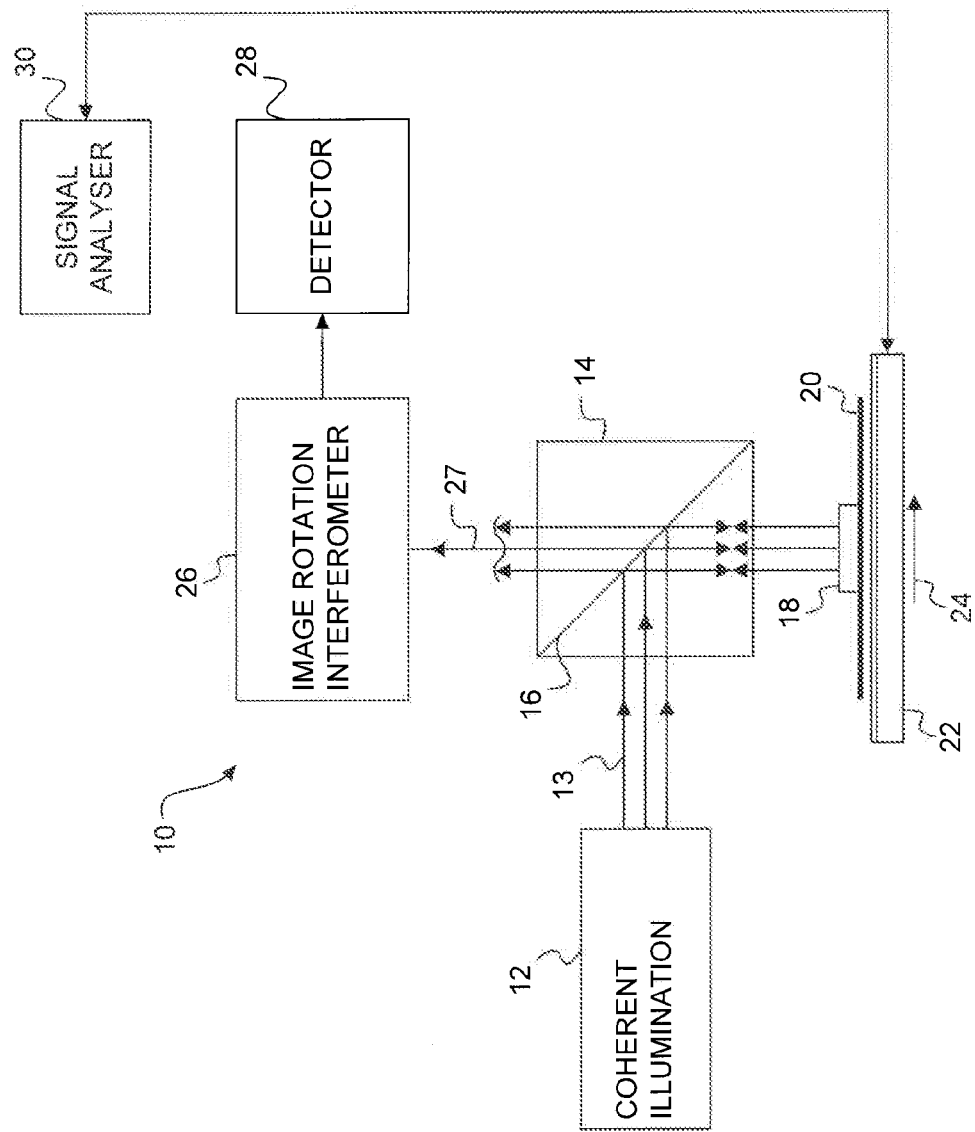
FIG. 1B is a schematic representation of an example alignment system according to an embodiment of the invention.

FIG. 1B is a schematic diagram illustrating an example alignment system 10. Alignment system 10 comprises a coherent illumination source 12, such as a laser, providing electromagnetic radiation 13, to a beamsplitter 14. A portion of the electromagnetic radiation is reflected off coating 16 to illuminate an alignment mark or target 18. The alignment mark or target 18 may have one hundred and eighty degree symmetry. By one hundred and eighty degree symmetry, it is meant that when the alignment mark 18 (also referred to as a "target") is rotated one hundred and eighty degree about an axis of symmetry perpendicular to the plane of the alignment mark 18, the alignment mark is substantially identical to the unrotated alignment mark. The axis for which this is true is called the axis of symmetry. The alignment mark 18 is placed on a substrate or wafer 20 that may be coated with a radiation-sensitive film.

The substrate 20 is placed on a stage 22. The stage 22 may be scanned in the direction indicated by arrow 24. Electromagnetic radiation reflected from the alignment mark 18 passes through the beamsplitter 14 and is collected by the image rotation interferometer 26. It should be appreciated that a good quality image need not be formed, but that the features of the alignment mark should be resolved. The image rotation interferometer 26 may be any appropriate set of optical-elements, and is preferably a combination of prisms, that form two images of the alignment mark, rotate one of the images with respect to the other one hundred and eighty degrees and then recombines the two images interferometrically so that when aligned with the alignment target 18, the electromagnetic radiation will interfere either in a polarization sense or in an amplitude sense, constructively or destructively, making readily detectable the center of the alignment mark 18. The optical ray passing through the center of rotation established by the interferometer, 26, defines the sensor alignment axis 27.

Detectors 28 receive the electromagnetic radiation from the image rotation interferometer 26. The detectors 28 then provide signals to the signal analyzer 30. The signal analyzer 30 is coupled to the stage 22 such that the position of the stage is known when the center of alignment mark 18 is determined. Therefore, the position of the alignment mark 18 is very accurately known with reference to the stage 22. Alternatively, the location of the alignment sensor 10 may be known such that the center of the alignment mark 18 is known with reference to the alignment sensor 10. Accordingly, the exact location of the center of the alignment target 18 is known relative to a reference position.

FIGS. 2A-E illustrate plan views of examples of different possible alignment marks. It should be appreciated that FIGS. 2A-E are only examples of different alignment marks and that many alignment marks may be utilized in practicing the present invention that can readily be determined by one skilled in the art.

FIG. 2A illustrates a square grid checkerboard alignment mark 18A (also known as a "target"). The target 18A is comprised of a plurality of two types of optically different squares, 34 and 36. The two types of squares may be differentiated by pattern, reflectance (amplitude and/or phase), or any combination of these. Alignment mark 18A functions primarily like two linear gratings oriented at right angles with respect to each other; one at an angle of +45 degrees with respect to the orientation of edge or line 32 and the other at an angle of +45 degrees with respect to edge or line 32.

FIG. 2B illustrates a diamond shaped alignment mark 18B. The alignment mark 18B is comprised of a plurality of vertical equally spaced lines 40 having spaces 38 there between.

FIG. 2C illustrates another alignment mark 18C. The alignment mark 18C has a plurality of lines 44 separated by spaces 42. The spaces 42 are of different spacing or dimensions. Therefore, the lines 44 have a different pitch or period. The different periods of lines 44 are symmetrical about a central line 46.

FIG. 2D illustrates another alignment target 18D. Alignment target 18D has alternating lines, which may be spaces 39 and lands 41. The spaces 39 and the lands 41 are angled forty-five degrees with respect to the longitudinal axis of the alignment target 18D.

FIG. 2E illustrates another alignment target 18E. Alignment target 18E has alternating lines, which may be spaces 45 and lands 43. The spaces 45 and the lands 43 are angled forty-five degrees with respect to the longitudinal axis of the alignment target 18E.

The signal detected from the illuminated alignment marks 18 can be affected by how well the illumination wavelengths are matched to the physical or optical characteristics of the alignment marks, or physical or optical characteristics of materials in contact with or adjacent to the alignment marks. Improved alignment mark signals that carry accurate information about the position of the marks can enhance overlay performance of the lithographic tool.

Figure 3:
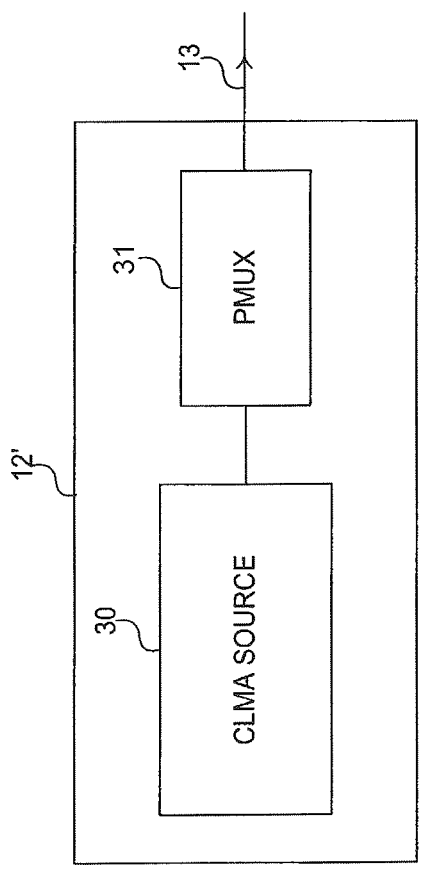
FIG. 3 is a schematic representation of a conventional illumination system.

FIG. 3 illustrates an example of a conventional alignment illumination source 12'. Illumination source 12' comprises a 4-color LASER Module Assembly (LMA) 30 and a Polarized Multiplexer (PMUX) 31. LMA 30 is configured to generate four distinct lasers. For example, LMA 30 may generate a 532 nm green wavelength, a 633 nm red wavelength, a 780 nm near infrared wavelength and an 850 nm far infrared wavelength beam of radiation. Polarized multiplexer 31 is configured to multiplex the four LASERs generated by LMA 30 into a single polarized beam 13 that serves as the illumination source for alignment system 10. However, CLMA 30 generates a green LASER that has a higher noise level. However, the color options of LMA 30 are limited to four colors with no bandwidth tunability options. The specific discrete wavelengths are often limited to the types of sources commercially available such as 532 nm laser, 632 nm HeNe laser, 635 nm SLD (Super Luminescent Diode) or Infra Red (IR) laser diodes.

While a selection of discrete wavelengths allows flexibility to choose a wavelength that improves the alignment signal for a given set of alignment marks and other local characteristics as described earlier, there may be unique lithographic mark or process characteristics that have only a narrow spectral band over which acceptable alignment mark signals are possible. If this optimal narrow band falls in between, or outside of, the set of discrete set point wavelength options conventionally available, the alignment performance will be adversely affected, perhaps to the level that alignment is not possible. This reduces flexibility to modify a lithographic process or alignment mark to enhance a product.

Another conventional approach has been to use a broad band illumination in order to, on average, improve the alignment signal. Broadband illumination requires optics to be corrected over the broad spectral range in use. This requires complex optical and coating designs that are typically more expensive, difficult to align, and are less radiometrically efficient. While alignment systems using discrete wavelength set points also need to be designed to operate over a wide spectral range, they don't need to do so simultaneously. Therefore embodiments presented herein provide a fully tunable source of radiation for alignment systems as described below.

Figure 4:
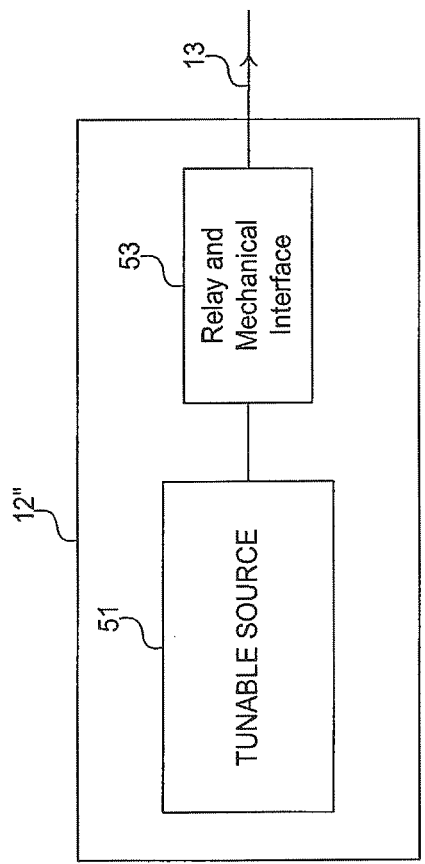
FIG. 4 is a schematic representation of an illumination system according to an embodiment of the invention.

FIG. 4 illustrates an exemplary illumination source 12" according to an embodiment of the invention. Illumination source 12" comprises a broadband tunable radiation source (BTRS) 51 coupled to a relay and mechanical interface 53. In an embodiment BTRS 51 includes a supercontinuum source and an Acousto-Optical-Tunable-Filter (AOTF). Relay and mechanical interface 53 are configured to adjust a profile of the radiation beam emitted from BTRS 51. According to an embodiment, illumination source 12" that can be tuned to specific narrow-band wavelengths over a continuous, flat and broad spectral range. Tuning can be accomplished at the lithographic system level. This tunability allows the selection of wavelengths that fall in a spectral gaps that lies between, or falls outside of, conventional discrete wavelength set points. to tune the wavelength for signal strength. This tunability also allows for tuning the alignment wavelength to the most stable alignment offset, which may be at a place different from the strongest available diffraction signal.

Some users may have a set of fixed processes and do not need a continuous tunable range. However, their processes may require a set of discrete alignment-system wavelength set points not currently available due to the limited selection of narrow-band illumination source types. For this situation, the desired tunablity can be achieved for a wide range of discrete set points by filtering the broadband source along with filters such as Rugate, dielectric and/or holographic filters. The bandwidth of a given set point can be adjusted to suit the application requirements. If the filter in use is an AOTF, multiple adjacent narrow-band set point wavelengths can be selected simultaneously. Additional filters can be used in conjunction with AOTF or a mechanism may be added that manipulates optics to achieve bandwidth adjustment.

The embodiments presented herein utilize a broadband source, such as an arc lamp or a Supercontinuum source. A means of tunable filtering selects only the desired wavelength set point, typically up to a few or several nanometers wide. The filtering mechanism for the broadband source is configured to block out-of-band wavelengths to a level that will have no adverse effect on alignment system functions. One such implementation would be the use of an Acousto-Optical Tunable Filter (AOTF) in conjunction with a Supercontinuum source. In an embodiment, the available spectral tuning range can cover from 450 nm to 2500 nm and will be limited only by the availability of the source, tuning mechanics and the optical design of the alignment system. An example embodiment using a Supercontinuum source in conjunction with an AOTF is described below.

Figure 5:
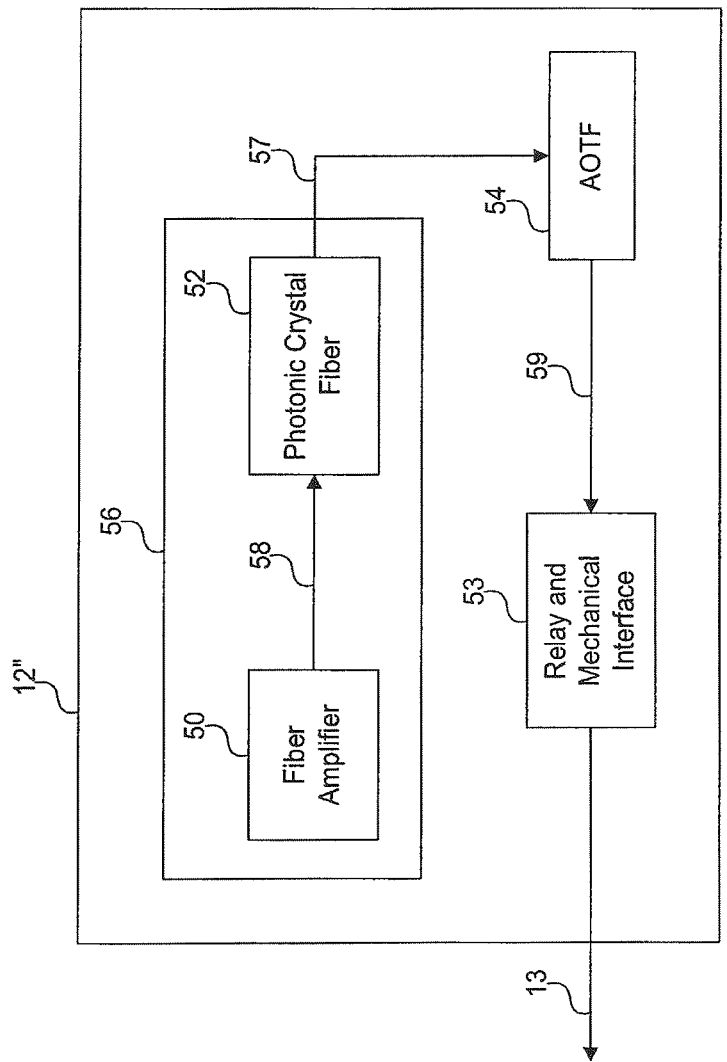
FIG. 5 further illustrates an example illumination system according to an embodiment of the invention.

FIG. 5 further illustrates illumination system 12" according to an embodiment of the invention. Illumination system 12" includes fiber amplifier 50, photonic crystal fiber 52, AOTF 54 and relay and mechanical interface 53. Fiber amplifier 50 and photonic crystal fiber 52 may be part of a Supercontinuum source 56.

Supercontinuum source 56 uses Supercontinuum generation that causes narrow-band radiation 58 from a source radiation, such as fiber amplifier 50, to be converted to radiation with a continuous, broad and flat spectral bandwidth that has low temporal coherence while maintaining high spatial coherence of source radiation 58. For example, a narrow-band radiation of 980 nm having a bandwidth of a few nanometers may be converted into continuous, flat and broad spectrum of radiation with high spatial coherence and a bandwidth ranging from 450 nm to 2500 nm. In flat spectrum radiation, such as radiation 57, the spectral density of intensity for each wavelength in the spectrum is constant. In continuous spectrum radiation, all wavelengths in a range or wavelengths, for example 450 nm to 2500 nm, are present. Radiation 57 has a high degree of spatial coherence and can be used as a point source i.e. the radiation can be focused in a diffraction limited point, which is one of the advantages of the invention since phase-grating alignment sensors typically require point source radiation. Spectral broadening may be accomplished by propagating optical pulses of radiation 58 through a strongly nonlinear device, such as photonic crystal fibers 56. Photonic crystal fibers 52 have chromatic dispersion characteristics which allow for a strong nonlinear interaction over a significant length of fiber. Even with fairly moderate input powers, very broad spectra are achieved which leads to generation of a rainbow of colors. In some cases, tapered fibers can also be used instead of photonic crystal fibers 52.

Fiber amplifier 50 is configured to provide pumped high intensity short pulse radiation 58 at a high repetition rate to photonic crystal fibers 52. Radiation 58 may have a higher radiance than thermal white light sources. For example, fiber amplifier 50 may be configured to generate pumped Erbium radiation in a narrow-band with a mean 980 nm wavelength in approximately 5 picosecond (ps) pulses and with a repetition rate of 80 Mhz. Erbium is used to dope fibers in fiber amplifier 50 so as to modify optical properties of the fibers and cause the fibers to act as optical amplifiers.

The physical processes behind supercontinuum generation in photonic crystal fibers 52 are based on chromatic dispersion and length of the fibers in fiber amplifier 50 (or other nonlinear medium), the pulse duration of radiation 58 generated by fiber amplifier 50, the initial peak power and the pump wavelength of radiation 58. When femtosecond pulses are used as source radiation 58, spectral broadening can be dominantly caused by self-phase modulation by photonic crystal fibers 52. When pumping with picosecond or nanosecond pulses of radiation 58, Raman scattering and four-wave mixing are implemented using photonic crystal fiber 52. The spatial coherence, with respect to the cross-spectral density, of output radiation 57 is usually very high, particularly if photonic crystal fibers 52 are a single-mode fiber. The high spectral bandwidth typically results in low temporal coherence. This kind of coherence is important for the generation of frequency combs in photonic crystal fibers 56, and it may or may not be achieved depending on parameters such as the seed pulse duration and energy, fiber length, and fiber dispersion. In an embodiment the photonic crystal fibers convert the narrow-band radiation 58 of 980 nm into continuous, broad and flat band radiation ranging from 450 nm to 2500 nm.

Output radiation 57 is desirably tuned using Acousto-Optical Tunable Filter (AOTF) 54. AOTF is a an electronically tunable narrow passband acoustic filter configured to modulate intensity and wavelength of radiation 57. AOTF 54 is configured to provide multiple simultaneous passband filters. In an embodiment, AOTF 54 is configured to generate upto eight simultaneous pass bands. AOTF 54 may be based on Bragg diffraction in a volume medium. Operation of AOTF 54 is described in further detail below with respect to FIG. 6. AOTF 54 generates tuned narrow-band linearly polarized radiation 59 that is fed into relay and mechanical interface 53. Relay and mechanical interface 53 are configured to adjust a profile of radiation 59 and generate radiation beam 13 that is focused on alignment targets 18.

Consistent with an embodiment of the present invention, the desired wavelength set point of the tunable filter such as AOTF 54 can be dynamically set such that this desired wavelength set point matches the relatively narrow spectral band of the alignment mark to which it provides the alignment mark signal above the predetermined acceptable threshold. In this way, quick fine tuning by the alignment system can be provided, e.g., on the fly tuning.

Figure 6:
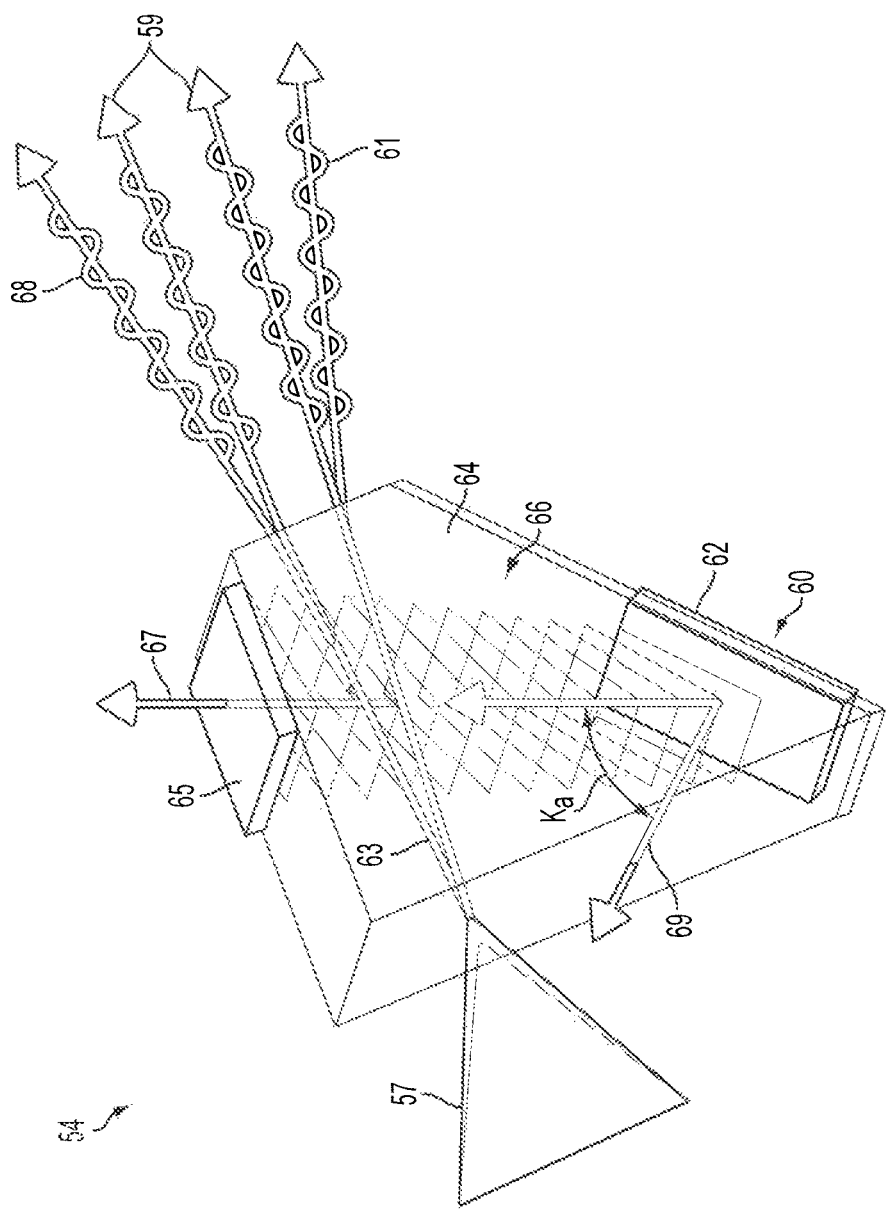
FIG. 6 illustrates an exemplary filter according to an embodiment of the invention.

FIG. 6 illustrates an exemplary AOTF 54 according to an embodiment of the invention. AOTF 54 includes an anistropic bifringement crystal 64, piezoelectric transducer 62 and acoustic absorber 65. Crystal 64 has an optical axis 67, an acoustic walkoff angle 69 and an extraordinary wave walkoff angle 63. Piezoelectric transducer 62 and acoustic absorber 65 are coupled to crystal 64 on opposite ends of optical axis 67.

In an embodiment, piezoelectric transducer 62 is configured to receive a radio frequency signal 60 that is applied to anisotropic crystal 64. The resultant periodic acoustical wave propagates along optical axis 67 through the volume of crystal 64. The acoustic wave creates a periodic pattern of alternating high/low refractive index in crystal 64. The resulting periodic index modulation approximates a Bragg diffraction grating such that a limited spectral band of input radiation 57 is diffracted. Incident non-polarized radiation 57 splits into orthogonally polarized diffracted ordinary wave 68, extraordinary first order wave 61 and un-diffracted zero$^{th}$ order waves that comprise narrow-band linearly polarized radiation 59. The diffracted spectral passband varies as a function of the applied acoustic frequency. The intensity of the passband wavelengths varies as a function of amplitude of radio frequency control signal 60.

The desired wavelength set point can be selected by various methods, including but not limited to one or more of manual, automatic, or user-assisted. In manual mode, a user may input a desired set point wavelength directly. Based on the selected wavelength a corresponding signal 60 is applied to radio frequency input 60. In automatic mode, such as during a calibration, alignment wavelength can be optimized by continuously monitoring alignment signals as a function of illumination wavelength and selecting the set point wavelength that maximizes signal quality or meets predetermined specifications by adjusting radio frequency input 60. In user assisted mode, a user my control one or more parameters, such as radio frequency input 60, used in the automated process. The set point wavelength can also be downloaded at the beginning of wafer lot via a process recipe file. This allows different wavelengths to be used for different wafer lot processing.

Figure 7:
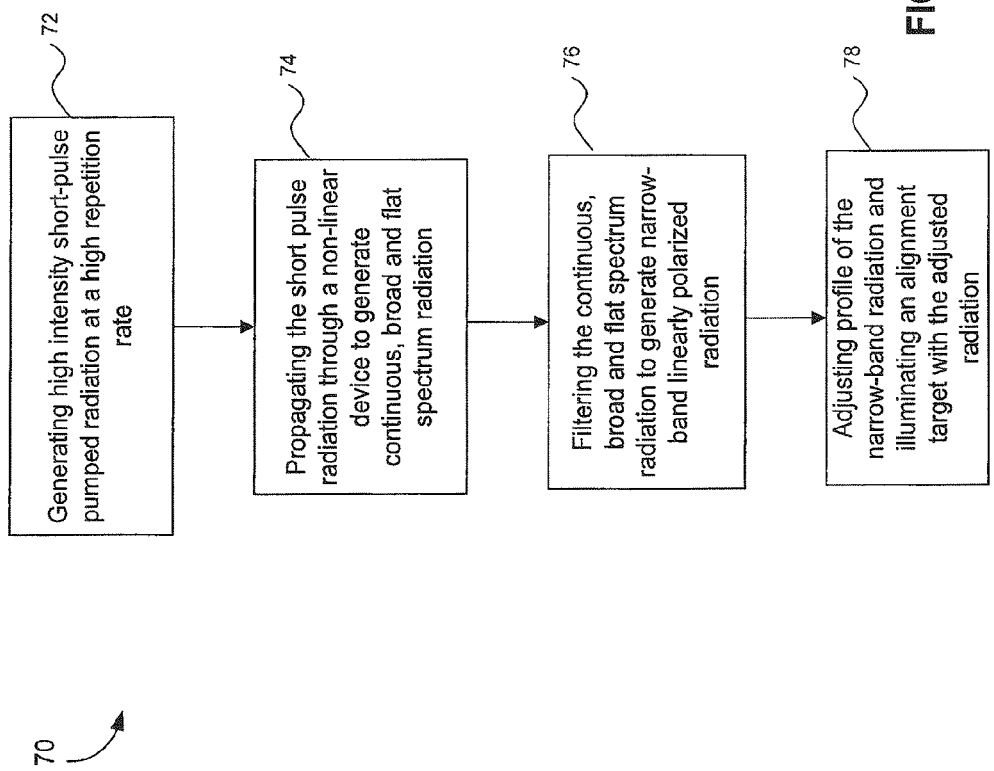
FIG. 7 is an example flowchart illustrating steps performed according to an embodiment of the invention.

FIG. 7 is an example flowchart 70 illustrating steps performed to generate a tunable wavelength source for an alignment system according to an embodiment of the invention. Flowchart 70 will be described with continued reference to the example operating environment depicted in FIGS. 1-6. However, flowchart 70 is not limited to these embodiments. Note that some steps shown in flowchart 70 do not necessarily have to occur in the order shown.

In step 72, high intensity pumped radiation with short pulses and a high repetition rate is generated. For example, pico or nanosecond pulsed Erbium radiation 58 is generated by fiber amplifier 50.

In step 74, the high intensity short-pulse radiation is propagated through a non-linear optical medium to generate radiation having a broad and flat spectrum. For example, radiation 58 is propagated through photonic crystal fiber 52 to generate radiation 57 that has a broad and flat spectrum. In an example the spectrum ranges from 450 nm to 2500 nm.

In step 76, the broad and flat spectrum radiation is filtered using a multi-passband filter to generate narrowband linearly polarized radiation. For example, broad and flat spectrum radiation 57 is filtered using AOTF 54 to generate narrowband linearly polarized radiation 59.

In step 78, a profile of the narrowband linearly polarized is to adjusted based on physical properties of an alignment target so as to provide higher order diffraction from the alignment target. The resulting radiation is used to illuminate alignment targets of a wafer. For example relay and mechanical interface 53 is used to adjust the profile of the narrow-band linearly polarized radiation 59 to generate radiation 13 that is used to illuminate an alignment target P1/P2 on wafer W of FIG. 1.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion," respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the teem substrate used herein may also refer to a substrate that already contains multiple processed layers.

The terms "radiation" and "beam" used herein encompass all types of electromagnetic radiation, including ultraviolet (UV) radiation (e.g., having a wavelength of or about 365, 248, 193, 157 or 126 nm) or extreme ultraviolet radiation.

The term "lens," where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g., semiconductor memory, magnetic or optical disk) having such a computer program stored therein. Further, the machine readable instruction may be embodied in two or more computer programs. The two or more computer programs may be stored on one or more different memories and/or data storage media.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

It is to be appreciated that the Detailed Description section, and not the Summary and Abstract sections, is intended to be used to interpret the claims. The Summary and Abstract sections can set forth one or more, but not all exemplary embodiments of the present invention as contemplated by the inventor(s), and thus, are not intended to limit the present invention and the appended claims in any way.

What is claimed is:

1. A wafer alignment system for aligning a wafer having a plurality of alignment targets which diffract radiation, comprising:
 a radiation source configured to convert narrow-band radiation into continuous, flat, and, broad-band radiation;
 an acoustically tunable narrow pass-band filter configured to:
  filter the broad-band radiation into narrow-band linearly polarized radiation, wherein the narrow-band linearly polarized radiation is focused on the plurality of alignment targets to enable alignment of the wafer, and
  select a plurality of narrow-band wavelength set points at a same time or nearly the same time; and
 a relay, and mechanical interface configured to:
  receive the narrow-band linearly polarized radiation from the acoustically tunable narrow pass-band filter; and
  adjust a profile, of the received narrow-band linearly polarized radiation based on physical properties of the alignment targets.

2. The system of claim 1, wherein the filter is configured to modulate intensity and wavelength of the broad-band radiation produced by the radiation source.

3. The system of claim 1, wherein the filter is configured to provide a plurality of pass-band filters at a same time or nearly the same time.

4. The system of claim 1, wherein the radiation source comprises a fiber amplifier configured to generate high intensity short pulse radiation with a high repetition rate.

5. The system of claim 1, wherein the filter is an Acousto-Optical Tunable Filter (AOTF).

6. The system of claim 1, wherein the filter comprises a volume medium configured to cause Bragg diffraction.

7. The system of claim 1, wherein the narrow-band radiation has a mean wavelength of approximately 980 nm.

8. The system of claim 1, wherein the broad-band radiation ranges from 450 nm to 2500 nm.

9. A method to align a wafer in a lithographic apparatus, comprising:
 generating a first high intensity short-pulse radiation;
 propagating the first radiation through a non-linear device to generate a second continuous, broad, and flat spectrum radiation;
 filtering, using an acoustically tunable filter, the second radiation acoustically to generate narrow-band linearly polarized radiation;
 selecting a plurality of narrow-band wavelength set points at a same time or nearly the same time;
 receiving, using a relay and mechanical interface, the narrow-band linearly polarized radiation from the acoustically tunable filter;
 adjusting a profile of the received narrow-band linearly polarized radiation; and
 illuminating an alignment target with the narrow-band radiation to enable alignment of the wafer.

10. The method of claim 9, wherein the filtering comprises modulating intensity and wavelength of the second radiation.

11. The method of claim 9, wherein the filtering comprises using a plurality of pass-band filters at a same time or nearly the same time.

12. The method of claim 9, wherein the first radiation is a high intensity short pulse radiation with a high repetition rate.

13. An illumination system in a lithographic apparatus, comprising:
 a radiation source configured to convert narrow-band radiation into continuous, flat, and broad-band radiation;
 an acoustically tunable narrow pass-band filter configured to:
  filter the broad-band radiation into narrow-band linearly polarized radiation, wherein the narrow-band linearly polarized radiation is focused on alignment targets of a wafer to enable alignment of the wafer, and
  select a plurality of narrow-band wavelength set points at a same time or nearly the same time; and
 a relay and mechanical interface configured to:
  receive the narrow-band linearly polarized radiation from the acoustically tunable narrow pass-band filter; and
  adjust a profile of the received narrow-band linearly polarized radiation based on physical properties of the alignment targets.

14. The system of claim 13, wherein the filter is configured to modulate intensity and wavelength of the broad-band radiation produced by the radiation source.

15. The system of claim 13, wherein the filter is configured to provide a plurality of pass-band filters at a same time or nearly the same time.

16. The system of claim 13, wherein the radiation source comprises a fiber amplifier configured to generate high intensity short pulse radiation with a high repetition rate.

17. The system of claim 13, wherein the radiation source has a repetition rate of 80 Mhz.

18. An alignment system comprising:
 an illumination source configured to provide tunable narrow-band wavelengths over a continuous broad spectral range, wherein the illumination source comprises:
  an acoustically tunable filter configured to:
   filter a broad-band radiation into narrow-band linearly polarized radiation, wherein the narrow band linearly polarized radiation is focused on alignment marks of a wafer to enable alignment of the wafer, and
   select a plurality of narrow-band wavelength set points at a same time or nearly the same time for detecting a position of the alignment mark on the wafer to align the wafer using the alignment mark;
  a relay and mechanical interface confirmed to:
   receive the narrow-band linearly polarized radiation from the acoustically tunable filter; and
   adjust a profile of the received narrow-band linearly polarized radiation based on physical properties of the alignment targets; and
  an optics system configured to cover the continuous broad spectral range of the illumination source.

19. The alignment system of claim 18, wherein the tunable filter is configured to enable selection of wavelengths in a spectral tuning range of about 450 nm to 2500 nm.

20. The alignment system of claim 18, wherein the tunable filter comprises a library of spectral filters.

21. The system of claim 18, wherein each of the plurality of narrow-band wavelength set points is a few or several nanometers wide.

* * * * *